United States Patent
Beiner et al.

(10) Patent No.: US 11,508,020 B2
(45) Date of Patent: *Nov. 22, 2022

(54) METHOD FOR OPERATING A POWER CONSUMPTION METERING SYSTEM AND POWER CONSUMPTION METERING SYSTEM

(71) Applicant: Energybox Ltd., Hong Kong (HK)

(72) Inventors: Dirk Beiner, Wanchai (HK); Tak Yan Lai, Wanchai (HK); Yiu Kwong So, Wanchai (HK)

(73) Assignee: ENERGYBOX LTD., Hong Kong (HK)

( * ) Notice: Subject to any disclaimer, the term of this patent is extended or adjusted under 35 U.S.C. 154(b) by 674 days.

This patent is subject to a terminal disclaimer.

(21) Appl. No.: 16/506,922

(22) Filed: Jul. 9, 2019

(65) Prior Publication Data
US 2021/0012434 A1    Jan. 14, 2021

(51) Int. Cl.
*G06Q 50/06* (2012.01)
*G01D 4/00* (2006.01)
(Continued)

(52) U.S. Cl.
CPC ............ *G06Q 50/06* (2013.01); *G01D 4/002* (2013.01); *G01D 4/02* (2013.01); *G01R 21/08* (2013.01); *G01R 22/063* (2013.01)

(58) Field of Classification Search
CPC .......... G06Q 50/06; G01D 4/002; G01D 4/02; G01D 2204/24; G01D 4/004; G01R 21/08; G01R 22/063; G01R 21/133; Y04S 20/30
See application file for complete search history.

(56) References Cited

U.S. PATENT DOCUMENTS 11,125,790 B2 *  9/2021  Beiner .................. H04Q 9/00
11,262,386 B2 *  3/2022  Donnal ............... G01R 21/133
(Continued)

FOREIGN PATENT DOCUMENTS

DE    112015005856 T5    10/2017

OTHER PUBLICATIONS

Bouhouras, Aggelos S. et al., "Load Signature Formulation for Non-Intrusive Load Monitoring Based on Current Measurements," Energies, vol. 10, Apr. 16, 2017, 21 pages.
(Continued)

*Primary Examiner* — Tung S Lau
(74) *Attorney, Agent, or Firm* — Slater Matsil, LLP

(57) ABSTRACT

A method for operating a power consumption metering system and a power consumption metering system are disclosed. In an embodiment a method include measuring, by a sensor deployed at a monitored site, high speed power consumption values over time to obtain a high speed value pattern of power consumption with a resolution of more than 1000 values per second, determining one or more harmonics of the high speed value pattern, measuring, by the sensor, low speed power consumption values over time to obtain a low speed value pattern of the power consumption with a resolution of less than 100 values per second, providing the harmonics and the low speed value pattern to a cloud based data processing system and identifying a status of a power consumer of the monitored site dependent on the measured harmonics and the low speed value pattern.

17 Claims, 3 Drawing Sheets

(51) Int. Cl.
*G01D 4/02* (2006.01)
*G01R 22/06* (2006.01)
*G01R 21/08* (2006.01)

(56) References Cited

U.S. PATENT DOCUMENTS

| | | |
|---|---|---|
| 2010/0042857 A1 | 2/2010 | Zommer |
| 2011/0251807 A1 | 10/2011 | Rada et al. |
| 2012/0116696 A1* | 5/2012 | Wank .................... G01R 31/42 |
| | | 702/58 |
| 2012/0123995 A1 | 5/2012 | Boot |
| 2012/0290230 A1* | 11/2012 | Berges Gonzalez ... G01D 4/004 |
| | | 702/61 |
| 2014/0172176 A1 | 6/2014 | Deilmann et al. |
| 2014/0172279 A1* | 6/2014 | Qiao .................... F02D 41/009 |
| | | 701/111 |
| 2016/0188763 A1 | 6/2016 | Beiner |
| 2018/0120380 A1* | 5/2018 | Giussani ............. G01R 31/346 |
| 2019/0011283 A1 | 1/2019 | Soutar et al. |
| 2019/0264935 A1 | 8/2019 | Taylor et al. |

OTHER PUBLICATIONS

Ebaid, Emad, et al., "Deducing Energy Consumer Behavior from Smart Meter Data," Future Internet, MDPI, vol. 9, Jul. 6, 2017, 25 pages.
Laughman, Christopher, et al,: "Power Signature Analysis," IEEE Power and Energy Magazine, vol. 1, No. 2, Apr. 2003, 8 pages.

\* cited by examiner

METHOD FOR OPERATING A POWER CONSUMPTION METERING SYSTEM AND POWER CONSUMPTION METERING SYSTEM

TECHNICAL FIELD

The disclosure relates to a method for operating a power consumption metering system and a corresponding power consumption metering system. In particular, the present disclosure relates to a power consumption metering system that allows an identification of a status of a power consumer based on a power consumption pattern.

BACKGROUND

With the prospect of global climate change, energy and power consumption and corresponding carbon dioxide emission are of particular importance in all areas of technology. A relatively large proportion of primary energy is used for the operation of residential, commercial and industrial buildings, for example, for lighting and heating, ventilation and air conditioning (HVAC). It is widely recognized that energy consumption in this area is one of the biggest carbon dioxide emission driver nowadays. In order to reduce carbon dioxide emissions worldwide, apart from utilizing more clean energy sources, energy efficiency in the building sector is thus one of the best opportunities to address the problems of global climate change. This is particularly true in view of growing populations, the widespread use of electricity driven technologies and an increase in the amount of man-made buildings on the planet.

In conventional energy distribution networks, the energy consumption of a site is typically measured at a central supply point, e.g., an electricity meter installed between a supply line of an utility provider and a first distribution panel of a given site, for example, a single building or a distinct part of a building such as an apartment or the like. In this way, all electrical energy consumed at that particular site can be measured, irrespective of the electrical distribution system of the given site.

The energy consumption measured at such a central supply point is usually used by the utility provider for billing purposes. Thus, at the end of a billing period such as a month or year, the utility provider usually prepares a utility bill based on the measured total consumption and provides it to the site manager or owner. Based on the provided utility bill, a site manager or owner can then determine whether he or she has stayed within a desirable energy budget or has exceeded it.

Such a conventional approach is sufficient for billing purposes. However, in times of high energy prices and a focus on energy efficiency, the data available in such a conventional scheme is insufficient in order to maintain a control over how the energy is actually consumed within a given site and also in order to estimate, at any given time, whether given energy targets will be met.

SUMMARY

Embodiments provide a method for operating a power consumption metering system. In particular, the method comprises: measuring high speed power consumption values over time with a sensor deployed at a monitored site to obtain a high speed value pattern of power consumption with a resolution of more than 1000 values per second, determining one or more harmonics of the high speed value pattern, measuring low speed power consumption values over time with the sensor to obtain a low speed value pattern of the power consumption with a resolution of less than 100 values per second, providing the harmonics and the low speed value pattern to a cloud based data processing system, and identifying a status of a power consumer of the monitored site dependent on the measured harmonics and the low speed value pattern.

Further embodiments provide a power consumption metering system comprising: a sensor deployed at a monitored site, the sensor being configured to measure granular-level power consumption, a power consumption meter, the power consumption meter being coupled with the senor and comprising a processor and memory storing instructions to execute in the processor, the instructions configured to determine a high speed value pattern of power consumption dependent on sensor data provided by the sensor, wherein the high speed value pattern of power consumption comprises a resolution of more than 1000 values per second, and to determine one or more harmonics of the high speed value pattern, and further to determine a low speed value pattern of power consumption dependent on the sensor data, wherein the low speed value pattern of the power consumption comprises a resolution of less than 100 values per second, a cloud based data processing system, the cloud based data processing system comprising a processor and memory storing instructions to execute in the processor, the instructions configured to identifying a status of a power consumer of the monitored site dependent on the measured harmonics and the low speed value pattern.

By determining the harmonics of the high speed value pattern an efficient transmission of the data to the cloud-based data processing system can be achieved. The analysis of the data can be carried by the cloud-based data processing system and thus with a high speed. There is no need to transfer the high speed value pattern with lots of values to the cloud-based data processing system. A pre-analysis is carried out by the power consumption meter. The low speed power consumption values are aggregated in parallel by the power consumption meter. The two values are transmitted to the cloud-based data processing system for further analysis. A resource-saving transfer and evaluation of the data can be achieved.

BRIEF DESCRIPTION OF THE DRAWINGS

The present invention will be further described with reference to the accompanying drawings, wherein.

Figure 1:
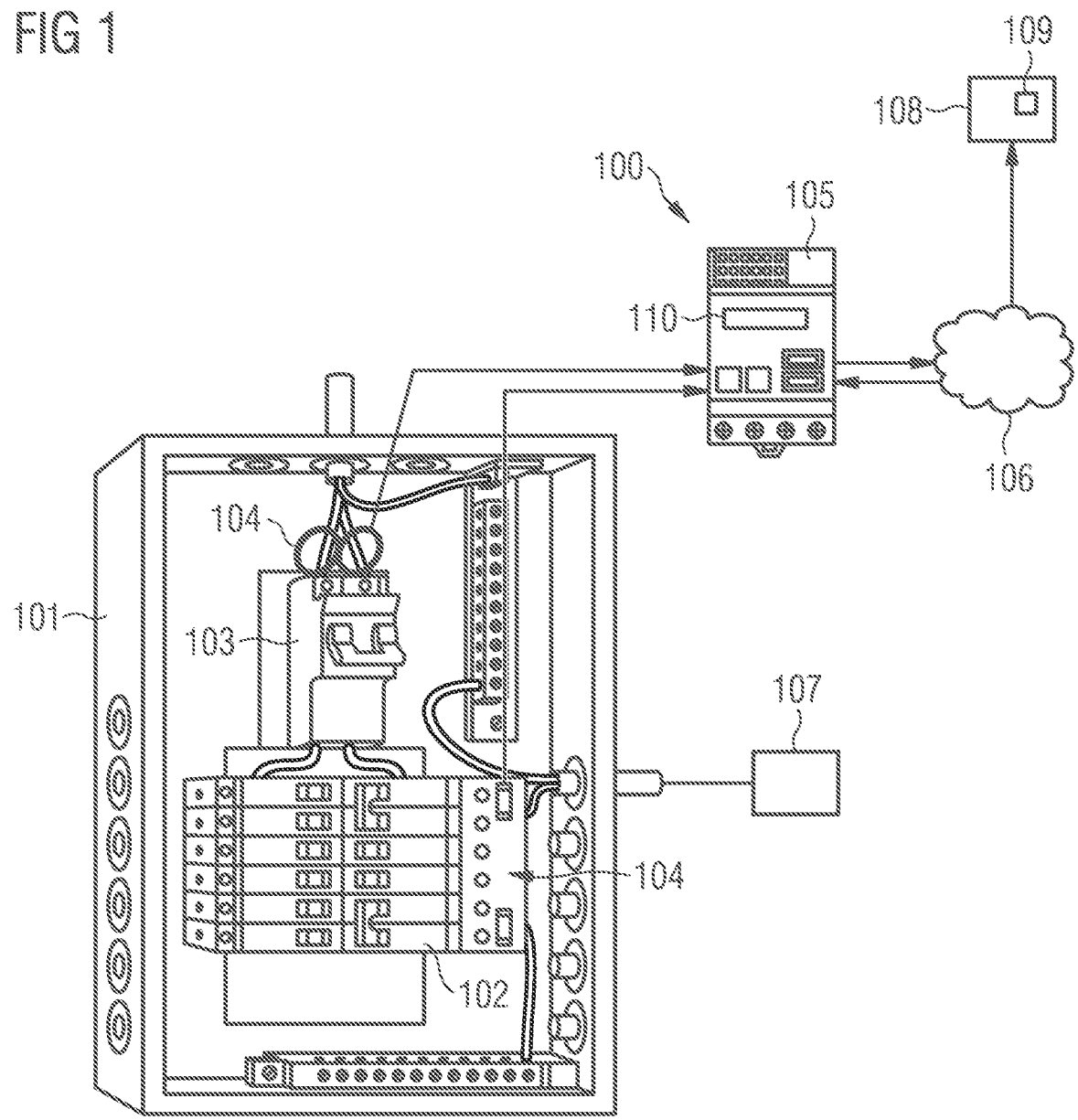
FIG. 1 shows a schematic diagram of a power consumption metering system.

While the invention is amenable to various modifications and alternative forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the scope of the invention as defined by the appended claims.

DETAILED DESCRIPTION OF THE ILLUSTRATIVE EMBODIMENTS

In the following detailed description of embodiments, reference is made to the accompanying drawings, which form a part hereof and in which are shown, by way of illustration, specific embodiments in which the invention may be practiced. The illustrated embodiments are not intended to be exhaustive of all embodiments according to the invention. It is to be understood that other embodiments may be utilized and structural or logical changes may be made without departing from the scope of the present invention. The following detailed description therefore is not to be taken in a limiting sense.

Exemplary embodiments herein provide a power consumption metering system 100. The power consumption metering system 100 is deployed at a site to be monitored, for example, a single building or a group of buildings. In the case that multiple buildings are to be monitored, each building may have its own metering system 100.

The power consumption metering system 100 comprises a fuse box 101. The fuse box may be connected to an energy distribution network. The network supplies electrical energy.

The fuse box 101 comprises a main disconnect switch 103. The fuse box 101 further comprises one or more circuit breakers 102.

Electrical energy and/or electrical power can be provided to a power consumer 107 that is arranged at the monitored side. The power consumer 107 may be any consumer, for example, lights, air conditioners, heaters, domestic appliances like washing machines or other household appliances, computers, chargers and any other device that is powered by electrical energy.

One or more sensors 104 are connected with the circuit breaker 102 and the disconnect switch 103. According to embodiments, only the circuit breaker 102 is equipped with a sensor 104. According to further embodiments, only the disconnect switch is equipped with a sensor 104.

For example, the sensor 104 is a sensing device based on magnetic flux density emitted by the circuit breaker 102 and/or the disconnect switch 103. This allows a low cost and easy installation, which simplifies the utilization of granular power monitoring systems. According to an embodiment, the sensor 104 is an electromagnetic based monitoring solution. For example, electromagnetic field radiation is detected by the sensor 104. Other types of sensors can be used.

Within the monitored site, the electrical energy supplied by the utility provider is distributed by the number of fuse boxes 101. Typically, the electrical energy provided to any specific endpoint and to the power consumer 107 within the site to be monitored is provided by at least one fuse box 101 and protected by at least one circuit breaker 102. In the exemplary embodiment shown in FIG. 1, the disconnect switch 103 and a multitude of circuit breaker 102 are shown. However, attention is drawn to the fact that the monitored site may contain only circuit breakers 102 and no disconnect switch 103. Furthermore, the monitored side may contain tens, hundreds or even thousands of fuse boxes 101 and/or circuit breakers 102.

In the described embodiment, each of the circuit breakers 102 comprises a corresponding sensor 104 assigned to it. The sensors 104 are placed on the circuit breakers 102 and the disconnect switch 103 in order to monitor the power consumption of the corresponding circuits leading to the electrical consumer 107 and other consumers. According to embodiments, the sensors 104 are mounted directly on the circuit breakers 102 and the disconnect switch 103. According to embodiments, the sensors 104 are mounted in the immediate vicinity of the circuit breakers 102 and the disconnect switch 103 respectively. In different embodiments, the sensors 104 may be associated with individual appliances, groups of circuit breakers, distribution panels, fuse boxes or any other distinct part of the energy distribution network within the site to be monitored.

The sensors 104 are referred to as granular-level sensors. The data they collect can be referred to as granular-level power consumption values.

The sensors 104 are configured to measure power consumption that is assigned to the respective circuit breaker 102, that the power consumer 107 is connected to.

The power consumption metering system 100 comprises a power consumption meter 105. The power consumption meter 105 is a smart meter device. The power consumption meter 105 is connected to the sensors 104. Data of the sensors 104 can be transferred to the power consumption meter 105 for further processing.

The power consumption meter is connected to a cloud-based data processing system 106. The cloud-based data processing system 106 is a system that uses shared computer system resources like processors and memory over the internet.

The cloud-based data processing system 106 and the power consumption meter 105 are connected to each other by a data network. For example, the network is a wireless network or a cable-based network. The network may use different communication standards like TCPIP or the world-wide web.

The sensors 104 are configured to measure the power consumption of the power consumer 107 with a high speed. For example, the resolution of the measuring comprises more than 1000 values per second. According to further embodiments, the resolution comprises more than 2000 values per second. According to further embodiments, the resolution comprises more than 3000 values per second. According to further embodiments, the resolution comprises more than 4000 values per second. According to further embodiments, the resolution comprises more than 5000 values per second. According to further embodiments, the resolution comprises more than 6000 values per second. According to a further embodiment, the resolution comprises more than 7000 values per second.

According to further embodiments, the resolution of the high speed values comprises 8000 values per second or more. For example, the resolution of the high speed value measuring is between 5000 values and 15000 values per second.

The power consumption meter 105 is configured to process the high speed values of the sensors 104.

Figure 2:
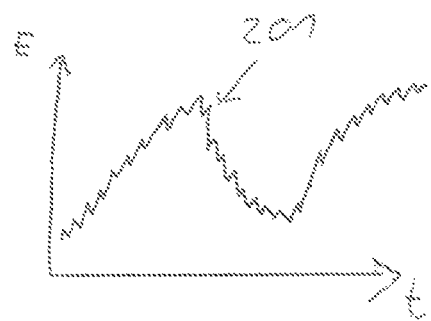
FIG. 2 shows a schematic diagram of a high speed value pattern according to an embodiment.

The power consumption meter 105 is configured to determine a high speed value pattern of power consumption with a resolution of more than 1000 values per second by computing consecutive measuring values of the sensor over time. An exemplary high speed value pattern 201 is shown in FIG. 2.

Figure 4:
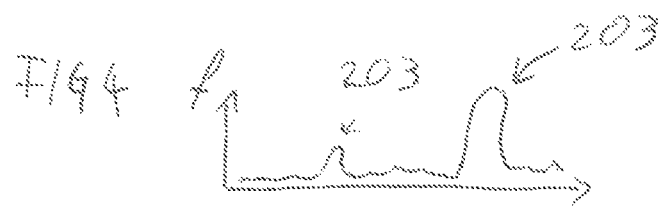
FIG. 4 shows a schematic diagram of harmonics of a high speed value pattern according to an embodiment.

The power consumption meter 105 is configured to apply an algorithm to the high speed value pattern. For example, the algorithm is stored on a memory of the power consumption meter 105. According to an embodiment, the algorithm is a fast Fourier transform (FFT). The fast Fourier transform converts the high speed power consumption value pattern, which is a signal from the sensor 104, to a representation in the frequency domain. With the fast Fourier transform one or more harmonics 203 of the high speed value pattern can be determined. Examples of harmonics 203 are shown in FIG. 4. According to a further embodiment, the algorithm is a different mathematical method than the fast Fourier transform. Any mathematical method may be used that is suitable to determine the one or more harmonics sufficiently fast. Alternatively or in addition to the fast Fourier transform another algorithm with equivalent value determination can be used. According to a further embodiment, the harmonics are detected using electronics like semiconductor chip.

The harmonics 203 are representative for the high speed value pattern.

Figure 3:
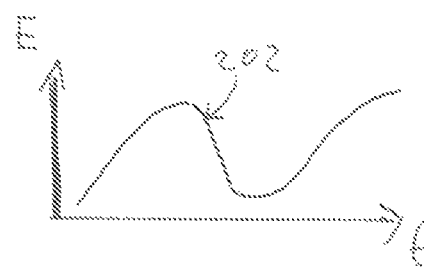
FIG. 3 shows a schematic diagram of a low speed consumption pattern according to an embodiment.

The power consumption meter 104 is configured to measure low speed power consumption values over time dependent on the signal of the sensor 104. A low speed value pattern 202 is determined over time out of consecutive power consumption values. The low speed value pattern comprises a resolution of less than 100 values per second. For example, the low speed value pattern comprises a resolution of 1 value per second. According to further embodiments, the low speed value pattern comprises a resolution of 1 value per 2 seconds. For example, the low speed value pattern comprises a resolution of less than 10 values per second and more than 1 value per 10 seconds. For example, the low speed value pattern comprises a resolution of 1 value per minute or 2 values per minute. An exemplary low speed value pattern 202 is shown in FIG. 3.

The determined harmonics 203 as well as the low speed value pattern 202 are transferred to the cloud-based data processing system 106. By the fact that the harmonics 203 are transferred to the cloud-based data processing system 106 instead of the high speed value pattern 201 itself, the quantity of data that needs to be transferred can be significantly reduced. For example, harmonics 203 of individual power consumption values and/or correlated power consumption values are transferred to the cloud.

The cloud-based data processing system 106 is configured to determine a status of the power consumer 107 dependent on the received harmonics 203 at the received low speed value pattern 202. Each power consumer 107 has a specific power consumption during operation. As part of the power consumption depending on the type of the device, during start-up, operation and shutdown of the device, a typical consumption pattern can be taken. The received harmonics 203 and low speed value pattern 202 can be compared to the known consumption pattern. Thus, it is possible to assign a specific power consumption to a specific power consumer 107 even if more than one power consumer 107 is connected to a single circuit breaker 102. For example, the harmonics 203 are used to distinguish different power consumer 107. The low speed value pattern 202 is used to determine the power that is consumed by the specific power consumer 107.

The cloud-based data processing system 106 is configured to take further influencing factors into account. The influencing factors may be factors like weather, temperature, time of day, time of year, type of day, overall power consumption of a monitored side, location and combinations thereof. Alternatively or in addition factory specifications of the manufacturer of the equipment and/or specifications of the operator of the power supply system for proper operation are taken into account For example, an air conditioner works differently in summer than in winter and differently on hot than on cold days. Taking the further influencing factors into account when comparing the determined harmonics and/or low speed value pattern 202 allows a more precise identification of the status of the power consumer.

The influencing factors may be factors like historical data of consumption pattern and harmonics. The determined harmonics and power consumption values can be compared to the historical data to determine the status of the power consumer 107. The historical data may be provided by the system 100 itself. Additionally or alternatively, the historical data may be provided by an external third-party provider.

The status of the power consumer 107 may be a status of operation like start-up, operation and shutdown or standby. For example, the status is a switched off status during which the consumer 107 is deactivated. The status may also be a operation cycle. Power consumption and changes in power consumption are known for a given operation cycle. Thus, the current sequential step of the operation cycle can be detected. The status may also be the type of consumer. Also a functionality or malfunction of the power consumer 107 can be identified. When specific harmonics 203 are different from a known consumption pattern of a known power consumer 107, this can be a sign of a malfunction of the power consumer 107. Therefore, a malfunction of the consumer 107 can be detected early.

The result of the identification of the status is transmitted to a user interface 109, no. For example, the user interface 109 is part of a mobile device 108 like a smartphone or a tablet computer. The mobile device 108 is connected to the cloud-based data processing system 106 by a telephone network. Other forms of devices and connections are possible.

For example, the user interface no is a display of the power consumption meter 105. The result and status of the identification of the status computed in the cloud-based data processing system 106 is presented on the user interface no of the power consumption meter 105. The user interface 109, 110 can also comprise a voice output, a light signal or other forms of transfer of information to a human user or a further computer device.

For example, the pattern on start-up contains signatures of the specific power consumer 107 like motor start-up, heater start-up, compressor start-up, that allows a repetitive unique identification of the specific power consumer 107 out of the power consumption stream. The harmonics 203 of the power consumption show an individual signature per power device 107. Timely patterns of consumption lead to an identification of combined operation like a washing machine motor and washing machine heater consuming power at the same time.

The power consumption metering system 100 performs analytics on power demand in terms of patterns and harmonics of a sum of consumption at the disconnect switch 103 or individual circuits of an electrical distribution system. That allows a detailed analysis of operation, status and power consumption of individual power consumers 107 connected to the energy distribution system. Deviations from known signatures in terms of patterns or harmonics allow an indication of health and functionality of devices and thus a predictive maintenance conclusion.

The detailed analysis of the consumption pattern and signatures is possible due to the high speed data analysis and the low speed data analysis performed by the power consumption metering system 100. High speed data has, for example, a sampling rate of 8000 or more samples per second. Furthermore the high speed data analysis is computed with an algorithm that extracts the harmonics 203 by a fast Fourier transform.

Low speed data means a pattern over time analysis such as motor ramp-up of a washing machine until high turns that take multiple seconds.

The combined analysis of the high speed value pattern and the low speed value pattern by the power consumption meter 105 and the cloud-based data processing system 106 allows the analysis of both high speed value pattern and low speed value pattern and extracts and self learns certain pattern behaviors of devices like power consumer 107. The power consumption meter 105 is used for a pre-analysis of the high speed data and aggregate in parallel the low speed power consumption. A result is a harmonics spectrum of the harmonics 203 and a total power consumption. These two values are transmitted to the cloud-based data processing system 106 and also persisted in the power consumption meter 105. The cloud-based data processing system 106 can then analyze the harmonics and the low speed value pattern 202 and the consumption pattern respectively to conclude on device type, status, health and more. The analytics in the cloud-based data processing system 106 can include other findings from other metering data like external data on weather or known device patterns from a database.

The power consumption metering system 100 is capable of metering all circuits in the fuse box 101 or a respective distribution panel and thus has a granular breakdown of that distribution panel. This allows a better performance of the cloud-based data processing system 106 as the diversity of amount of devices running in parallel on individual circuits is limited.

For example, the resolution of the high speed power consumption pattern and/or the resolution of the low speed power consumption pattern can be changed by the cloud-based data processing system 106, for example, dependent on available computing capacity and/or available transmission capacity.

The power consumption metering system 100 allows sum metering of power consumption together with a breakdown of the power consumption on a detailed device level. Furthermore a status of the devices such as time of operation or health can be determined by the power consumption metering system 100.

Figure 5:
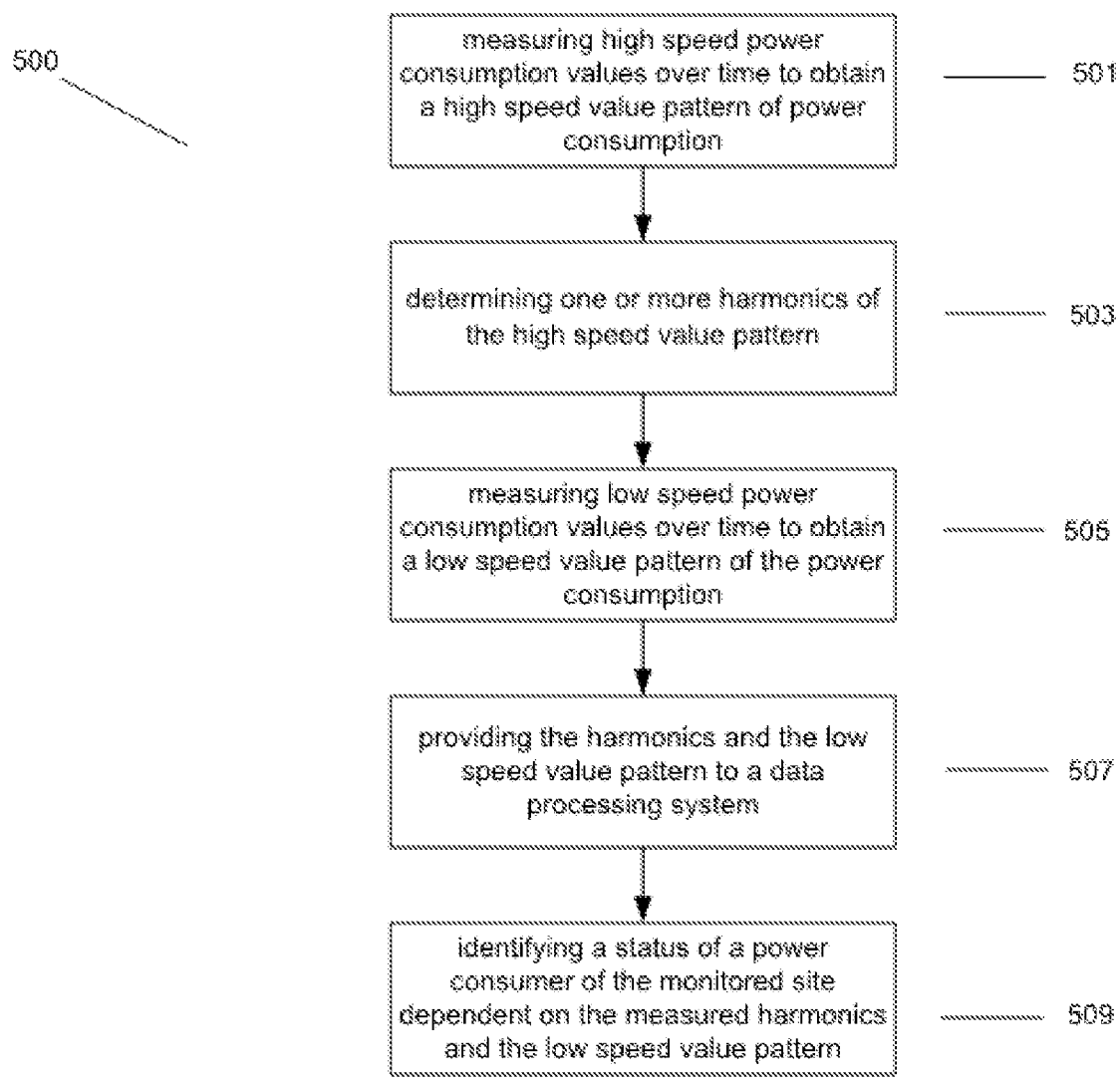
FIG. 5 shows a method for operating a power consumption metering system according to an embodiment.

FIG. 5 shows an embodiment of a method 500 for operating a power consumption metering system. The method includes measuring, by a sensor deployed at a monitored site, high speed power consumption values over time to obtain a high speed value pattern of power consumption with a resolution of more than 1000 values per second 501 and determining one or more harmonics of the high speed value pattern 503. The method further comprises measuring, by the sensor, low speed power consumption values over time to obtain a low speed value pattern of the power consumption with a resolution of less than 100 values per second 505, providing the harmonics and the low speed value pattern to a data processing system 507 and identifying a status of a power consumer of the monitored site dependent on the measured harmonics and the low speed value pattern 509.

What is claimed is:

1. A method for operating a power consumption metering system, the method comprising:
   measuring, by a sensor deployed at a monitored site, high speed power consumption values over time to obtain a high speed value pattern of power consumption with a resolution of more than 1000 values per second;
   determining one or more harmonics of the high speed value pattern;
   measuring, by the sensor, low speed power consumption values over time to obtain a low speed value pattern of the power consumption with a resolution of less than 100 values per second;
   providing the harmonics and the low speed value pattern to cloud based a data processing system; and
   identifying a status of a power consumer of the monitored site dependent on the measured harmonics and the low speed value pattern.

2. The method according to claim 1, further comprising:
   providing representative harmonics and a representative low speed value pattern which are representative for a status of the power consumer; and
   comparing the measured harmonics with the representative harmonics and the measured low speed value pattern with the representative low speed value pattern to identify the status of the power consumer.

3. The method according to claim 1, wherein determining the one or more harmonics comprises converting the high speed value pattern to the one or more harmonics via a fast Fourier transform.

4. The method according to claim 1, further comprising:
   measuring an external influencing factor; and
   identifying the status of the power consumer dependent on the external influencing factor.

5. The method according to claim 4, wherein the external influencing factor comprises a factor selected from the group consisting of weather, a temperature, a time of a day, a time of a year, a type of a day, an overall power consumption of the monitored site, a factory specification, an operation specification, a location and combinations thereof.

6. The method according to claim 1, wherein the status of the power consumer comprises a status selected from the group consisting of a start-up, an operation, a shutdown, a standby, a switched off, an operation cycle, a type of consumer, a functionality and combinations thereof.

7. The method according to claim 1, further comprising outputting the status of the power consumer on a user interface, wherein the user interface comprises a display.

8. The method according to claim 1, further comprising outputting the status of the power consumer on a user interface of a mobile device.

9. The method according to claim 1, wherein the sensor is configured to measure granular-level power consumption values of the power consumer.

10. The method according to claim 1, further comprising:
    providing historical data, the historical data selected from the group consisting of: historical harmonics, historical low speed value patterns, historical statuses of the power consumer and combinations thereof; and
    identifying the status of the power consumer of the monitored site dependent on the historical data.

11. A power consumption metering system comprising:
    a sensor deployed at a monitored site, the sensor configured to measure granular-level power consumption;
    a power consumption meter coupled to the sensor, the power consumption configured to:
      determine a high speed value pattern of power consumption dependent on sensor data provided by the sensor, wherein the high speed value pattern of power consumption comprises a resolution of more than 1000 values per second;
      determine one or more harmonics of the high speed value pattern; and
      determine a low speed value pattern of power consumption dependent on the sensor data, wherein the low speed value pattern of the power consumption comprises a resolution of less than 100 values per second, a cloud based data processing system configured to identify a status of a power consumer of the monitored site dependent on the measured harmonics and the low speed value pattern.

12. The power consumption metering system according to claim 11, wherein the power consumption meter is further configured to convert the high speed value pattern to the one or more harmonics via a fast Fourier transform.

13. The power consumption metering system according to claim 11, wherein the data processing system is further configured to identify the status of the power consumer depend on an external influencing factor.

14. The power consumption metering system according to claim 11, wherein the data processing system is further configured to:

store historical data selected from the group consisting of historical harmonics, historical low speed value patterns, historical statuses of the power consumer and combinations thereof; and identify the status of the power consumer of the monitored site dependent on the historical data.

15. The power consumption metering system according to claim 11, further comprising a user interface to output the status of the power consumer.

16. The power consumption metering system according to claim 15, further comprising a mobile device, wherein the user interface is part of the mobile device.

17. The power consumption metering system according to claim 15, wherein the user interface is part of the power consumption meter.

* * * * *